United States Patent [19]

Sakakibara

[11] Patent Number: 6,072,561
[45] Date of Patent: Jun. 6, 2000

[54] EXPOSURE METHOD AND APPARATUS

[75] Inventor: Yasuyuki Sakakibara, Ibaraki-ken, Japan

[73] Assignee: Nikon Corporation, Tokyo, Japan

[21] Appl. No.: 08/838,359

[22] Filed: Apr. 8, 1997

[30] Foreign Application Priority Data

Apr. 10, 1996 [JP] Japan .................................. 8-113265

[51] Int. Cl.[7] ............................ G03B 27/42; G03B 27/72
[52] U.S. Cl. .................................. 355/53; 355/55; 355/71
[58] Field of Search ................................ 355/53, 67, 71, 355/55; 430/5; 356/399, 400, 401; 250/548

[56] References Cited

U.S. PATENT DOCUMENTS

| | | | |
|---|---|---|---|
| 4,869,999 | 9/1989 | Fukuda et al. ............................ | 355/55 |
| 4,931,830 | 6/1990 | Suwa et al. ............................... | 355/71 |
| 5,255,050 | 10/1993 | Kitagawa .................................. | 355/53 |
| 5,311,362 | 5/1994 | Matsumoto et al. ....................... | 355/71 |
| 5,489,966 | 2/1996 | Kawashima et al. ..................... | 355/53 |
| 5,502,311 | 3/1996 | Imai et al. . | |
| 5,621,500 | 4/1997 | Shiraishi .................................. | 355/71 |
| 5,661,546 | 8/1997 | Taniguchi ................................. | 355/53 |
| 5,710,620 | 1/1998 | Taniguchi ................................. | 355/53 |
| 5,737,063 | 4/1998 | Miyachi ................................... | 355/53 |
| 5,742,376 | 4/1998 | Makinouchi ............................. | 355/53 |

Primary Examiner—Alan A. Mathews

[57] ABSTRACT

When only a selected area of a mask is being projected onto a photosensitive substrate, a permissible range of positions of the photosensitive substrate along the optical axis of a projection optical system is determined, based on the image curvature aberration and depth of focus of the projection optical system within a range corresponding to the selected area. Accordingly, the pattern in the selected area will be projected onto the photosensitive substrate in a properly focused imaging state. The photosensitive substrate is then positioned within the determined permissible range of positions along the optical axis, and the selected area of the mask is projection-exposed onto the photosensitive substrate.

27 Claims, 6 Drawing Sheets

EXPOSURE METHOD AND APPARATUS

BACKGROUND OF THE INVENTION

The present invention relates to an exposure method and apparatus for projecting an image of a pattern that has been formed on a mask, through projection optics, onto a photosensitive substrate. More particularly, the present invention relates to a method and apparatus for exposing a mask pattern on a substrate in a good or properly focused imaging state.

Recent demands for higher levels of integration in semiconductor devices have created corresponding requirements for higher resolution in projection exposure equipment. This has resulted in the use of projection optics with greater (larger-numbered) numerical apertures. In general, in an optical system, the depth of focus of the image is inversely proportional to the square of the numerical aperture. In other words, increasing the numerical aperture makes it harder to keep shot areas on the substrate within the (reduced) depth of focus of the optics. In the past, there have been auto-focus mechanisms that can measure the position of the exposure surface of the photosensitive substrate to detect the positional displacement along the optical axis of the optical system between the exposure surface of the substrate and the actual image formation plane of the projection optics, at prescribed measurement points within the shot areas of the photosensitive substrate. The position of the photosensitive substrate in the optical axis direction of the optical system is then adjusted to keep this displacement within a prescribed tolerance (the depth of focus).

Projection optical systems generally have "image curvature aberration," resulting in positional offset between off-axis and on-axis portions of the formed image. Therefore, in order to have high-resolution exposure over the entire shot area on the photosensitive substrate surface, the position of the substrate along the optical axis of the projection optics must be controlled in a manner that takes the image curvature aberration of the optical system into account. In other words, a permissible range of positions must be determined along the optical axis within which the surface of the shot area will be within the depth of focus of the optical system. The exposure can then be performed with the photosensitive substrate positioned within that range.

In this type of projection exposure system, the entire mask is commonly expose-transferred onto each shot area of the photosensitive substrate, one by one. The exposure can also be performed, however, with portions of the mask blocked out so that only a prescribed or selected area on the mask is transferred to the photosensitive substrate. In this mode as well, the position of the photosensitive substrate along the optical axis of the optical system is adjusted by a method similar to that used when the entire mask is exposed. In other words, the permissible range of positions along the optical axis of the projection optics must be determined for each shot area on the photosensitive substrate, so as to ensure that the entire shot area surface will be kept within the depth of focus of the projection optical system.

SUMMARY OF THE INVENTION

Accordingly, it is an object of the present invention to overcome the problems developed in prior art solutions.

In consideration of the above, the illustrated embodiment of the present invention was devised with the objective of providing an exposure method through which the alignment of the position of a photosensitive substrate along the optical axis of a projection optical system can be performed at high speed.

It is a further objective of the present invention to provide a projection exposure apparatus through which the alignment of the position of a photosensitive substrate along the optical axis of a projection optical system can be performed at high speed.

The present invention solves the above problems as follows: In a first mode of the present invention, in an exposure method for illuminating a mask with exposure light, in order to projection-expose an image of a pattern formed in the mask onto a photosensitive substrate, through a projection optical system, wherein only a prescribed or selected area of the mask will be projected onto the photosensitive substrate, a permissible range of positions of the photosensitive substrate is determined along the optical axis of the optical system during exposure of the photosensitive substrate, based on the image curvature aberration and depth of focus of the projection optical system within a range corresponding to the prescribed area. Thus the pattern in the prescribed area will be projected onto the photosensitive substrate in a properly focused imaging state. The photosensitive substrate is then positioned within the determined permissible range of positions along the optical axis, and the prescribed area projection-exposed onto the photosensitive substrate.

It is also desirable, when positioning the photosensitive substrate along the optical axis of the projection optical system to sense the position of the photosensitive substrate along the optical axis.

A second mode of the present invention comprises, in projection exposure apparatus for projection-exposing an image of a pattern formed in a mask onto a photosensitive substrate through a projection optics system, the following: an illumination means for flooding the mask with illumination light; a regulation means for regulating the illumination range of the illumination light with respect to the mask such that only a prescribed or selected area of the mask will be projected onto the photosensitive substrate. Drive means are included for making it possible to change the position of the photosensitive substrate along the optical axis of the projection optical system. Position measurement means measure the position of the photosensitive substrate along the optical axis. Memory means stores data related to the projection optical system. A computation means computes a permissible range of positions of the photosensitive substrate along the optical axis of optical system, during exposure of the photosensitive substrate, based on data stored in the memory means, such that the pattern in the prescribed area of the mask will be projected onto the photosensitive substrate in a properly focused imaging state. Finally, a control means is included for accessing measurement values obtained by the position measurement means to control the drive means in order to position the photosensitive substrate within the determined permissible range of positions computed by the computation means.

In a preferred embodiment of the present invention, the image curvature aberration and the depth of focus of the projection optical system is among the data stored by the memory means.

In another preferred embodiment it is desirable for the position measurement means to incorporate an offset based on the image curvature aberration of the optical system over a range corresponding to the prescribed area of the mask.

In the first mode of the present invention, as described above, when only a prescribed area of the mask is projection-exposed onto the photosensitive substrate, a means such as an illumination field stop (mask blind) can be used to regulate the illumination range within which the illumination light will flood the mask. When this is done, a permissible range of positions of the photosensitive substrate along the optical axis of the optical system can be determined based on the image curvature aberration and depth of focus of the projection optical system within a range corresponding to the prescribed area. In this way, the pattern in the prescribed area of the mask will be projected onto the photosensitive substrate in a properly focused imaging state. That is, the permissible range of positions of the photosensitive substrate along the optical axis can be determined using the image curvature aberration for only that portion of the total projection area of the projection optical system for the prescribed area of the mask. When done in this manner, the permissible range of photosensitive substrate positions along the optical axis (focus tolerance range) is broader than it would be if the range had been determined using the image curvature aberration of the projection optical system for the entire area of the mask. The end result is that during exposure, the process of positioning the photosensitive substrate along the optical axis of the optical system is easier, thus reducing the time required to bring the substrate within the determined permissible range.

Also, in a second mode of the present invention, if only a prescribed area of the mask is being projected onto the photosensitive substrate, the illumination range of the illumination light from an illumination means is regulated by a regulation means. Data on the image curvature aberration and depth of focus of the optical system can be stored in a memory means. A computation means computes a permissible range of positions along the optical axis for the photosensitive substrate during its exposure. This computation is based on, from among data stored in the memory means, that data related to the image curvature aberration and depth of focus of the projection optical system within a range corresponding to the prescribed area of the mask, such that the pattern in the prescribed area of the mask will be projected onto the photosensitive substrate in a properly focused imaging state. Then a control means accesses measurement values obtained by the position measurement means as it controls the drive means to position the photosensitive substrate within the determined permissible range of positions, as computed. In doing this, as was true in the first mode of the invention, described above, the permissible range of positions of the photosensitive substrate along the optical axis is determined using the image curvature aberration for only that portion of the total projection area of the projection optical system for the prescribed area of the mask, thus increasing the permissible range of photosensitive substrate positions along the optical axis (focus tolerance range) over what it would have been had the range been determined using the image curvature aberration of the projection optical system for the entire area of the mask. The end result of this is that the process of positioning the photosensitive substrate along the optical axis of the optical system is easier, thus reducing the time required to bring the substrate within the determined permissible range.

BRIEF DESCRIPTION OF THE DRAWINGS

The above and other objects, features, and advantages of the present invention will become more apparent from the following detailed description taken with the accompanying drawings, in which.

DESCRIPTION OF THE PREFERRED EMBODIMENT

An embodiment of the present invention will now be explained based on the working example described below. In this example, the method and apparatus incorporating the principles of the present invention is applied in a projection exposure system for semiconductor device fabrication.

Figure 1:
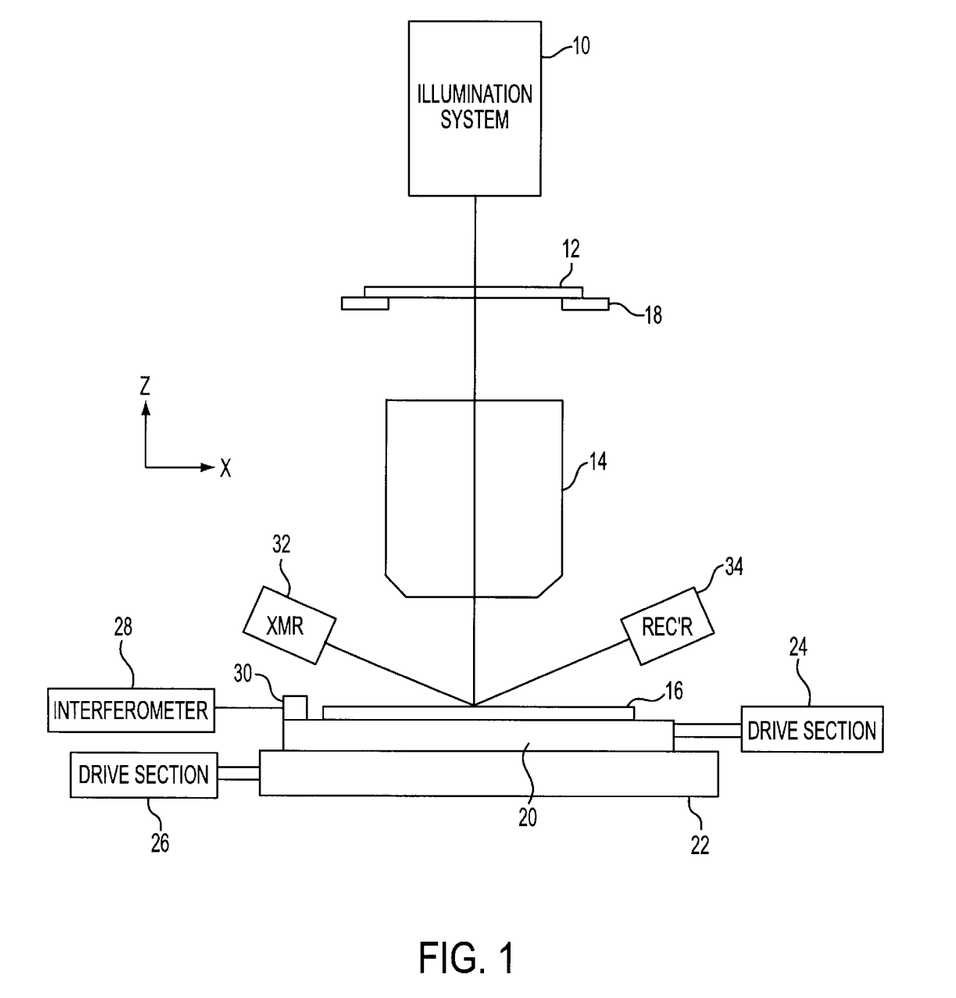
FIG. 1 is a conceptual drawing (elevation) showing the configuration of the projection exposure apparatus in a preferred embodiment of the present invention.

First, a simplified description of the configuration of the projection exposure apparatus will be presented, with reference to FIG. 1. In the projection exposure apparatus of this example, a light beam emitted from an illumination system 10 passes through a projection optical system 14, to transfer (expose) onto a wafer 16, a prescribed pattern formed on reticle 12. The projection optical system 14 is configured to project the pattern of reticle 12 onto wafer 16 at a reduction ratio of 1/5. Wafer 16 is coated with a photoresist material that is photosensitive to the light being emitted by the illumination system 10.

The reticle 12 is held fast to a reticle stage 18 by vacuum-induced suction. At the other end, wafer 16 is attached to an XY stage 22 through a Z-leveling stage 20. The Z-leveling stage 20 is driven by motors, etc. in a Z-stage drive section 24, to position the wafer 16 in the optical axis of the projection optical system 14 (hereinafter referred to as the Z-axis) and in leveling directions. This positioning by the Z-stage drive section 24 adjusts the focus of wafer 16 relative to the projection optical system 14. The XY stage 22 is driven by an XY stage drive section 26 to position wafer 16 (through Z-leveling stage 20) in a plane perpendicular to the optical axis of projection optical system 14 (XY plane). Movement mirror 30, which reflects a laser beam emitted from a laser interferometer 28, is mounted on Z-leveling stage 20 such that the position of wafer 16 (Z-leveling stage 20) in the XY plane can be measured by laser interferometer 28. Although only interferometer 28 and movement mirror 30, which measure X-axis position, are shown in the drawing, an interferometer and movement mirror are also provided for measuring the Y-axis position of Z-leveling stage 20.

Provided at the bottom end of projection optical system 14 are a light transmitter 32 and light receiver 34 of the AF (auto-focus) sensor, which measures the height of the surface of wafer 16 (its position along the Z-axis). The sensor is set up so that light emitted from light transmitter 32 is reflected off of the surface of wafer 16 and received by light receiver 34. The light signal received by light receiver 34 is then converted to an electrical signal to measure the position of the surface of wafer 16. The AF sensor (32 and 34) will be explained in greater detail later, with reference to FIG. 3.

Figure 2:
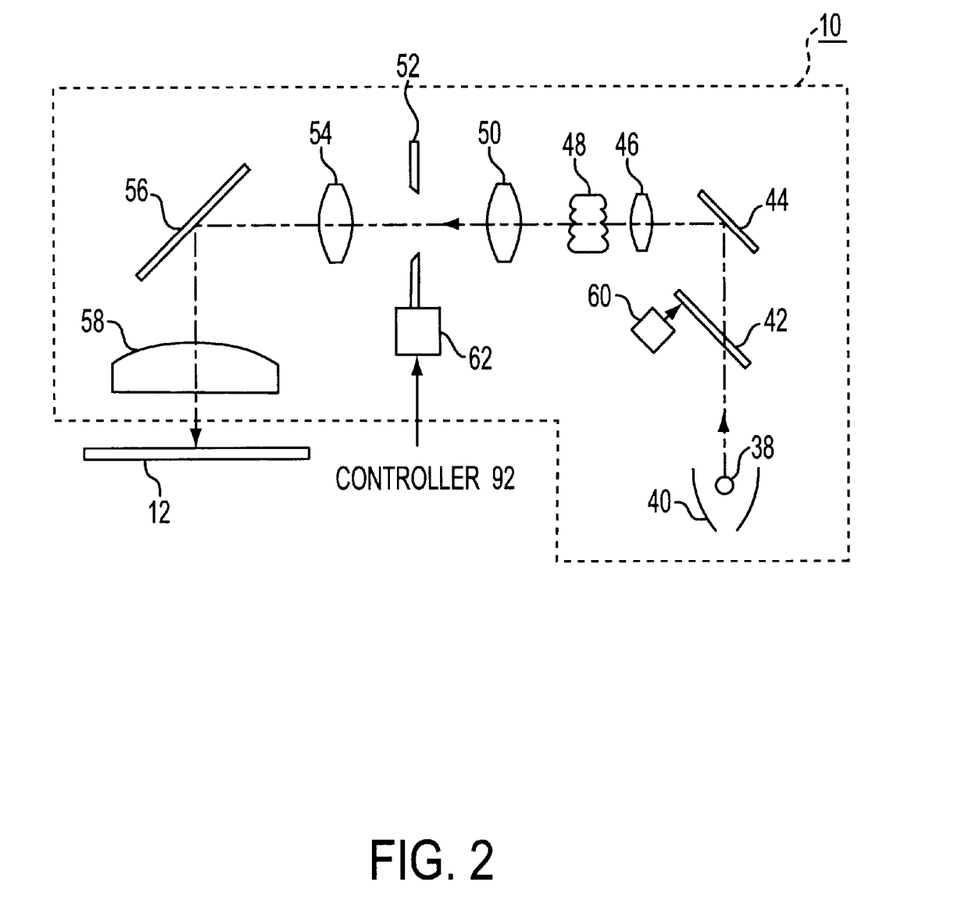
FIG. 2 is a schematic diagram showing the configuration of the illumination system in the projection exposure apparatus of the embodiment of FIG. 1.

Next, the configuration of illumination system 10 of the projection exposure apparatus of FIG. 1 will be described with reference to FIG. 2. Illumination system 10 comprises the following components:

extra-high-pressure mercury vapor lamp 38;

elliptical mirror 40, which reflects the light emitted by mercury vapor lamp 38;

shutter 42, which is placed near the second focus point for light reflected from elliptical mirror 40;

mirror 44, which reflects the light passed through shutter 42;

input lens 46, which receives the light reflected by mirror 44;

fly-eye lens 48, which receives the light transmitted by input lens 46;

first relay lens 50, which receives the light transmitted by fly-eye lens 48;

variable field-stop (reticle blind) 52, which receives the light transmitted by first relay lens 50;

second relay lens 54, which receives the light passed by reticle blind 52;

mirror 56, which reflects the light transmitted by second relay lens 54; and condenser lens 58, which directs the light reflected by mirror 56 onto reticle 12.

Light sources other than mercury vapor lamp 38 may be used in the illumination system 10. Possible examples would include laser light sources such as KrF or ArF excimer lasers. The shutter 42 is operated by a motor 60 to open and close the illumination light path. A four-leaf rotary shutter, for example, might be used for this purpose. Fly-eye lens 48 is placed in a plane perpendicular to the optical axis such that the reticle-end focal plane will approximate the Fourier transform plane (pupil conjugate plane) of the reticle pattern. Reticle blind 52 is positioned in a conjugate relationship (imaging-formation relationship) relative to the surface of reticle 12 on which the pattern is formed. Reticle blind 52 is operated by a blind drive section 62, which opens and closes the multi-leaf movable blades (not illustrated) of the blind to change its aperture size, shape, and position to set the illumination field of reticle 12 as desired. The blind drive section 62 is operated in turn by a controller 92 whose operation will be described later, with respect to FIG. 4.

In illumination system 10, light emitted from the mercury vapor lamp 38 is reflected by elliptical mirror 40, and after converging at the second focus point thereof, passes through shutter 42. After being reflected by mirror 44 and transmitted by input lens 46, the light then becomes incident upon the fly-eye lens 48. The light passing through fly-eye lens 48 is transmitted by first relay lens 50 to arrive at reticle blind 52. In reticle blind 52, the size, shape and position of the incident light beam is adjusted. The light beam that passes through the aperture portion of reticle blind 52 continues on through second relay lens 54, mirror 56, and main condenser lens 58 to illuminate the pattern area of reticle 12 with roughly equal intensity throughout the area. The light passed through the pattern area of reticle 12 is incident into both-end-telecentric projection optical system 14 (see FIG. 1), to project a 1/5 X reduced image of the pattern on a shot area of wafer 16.

Figure 3:
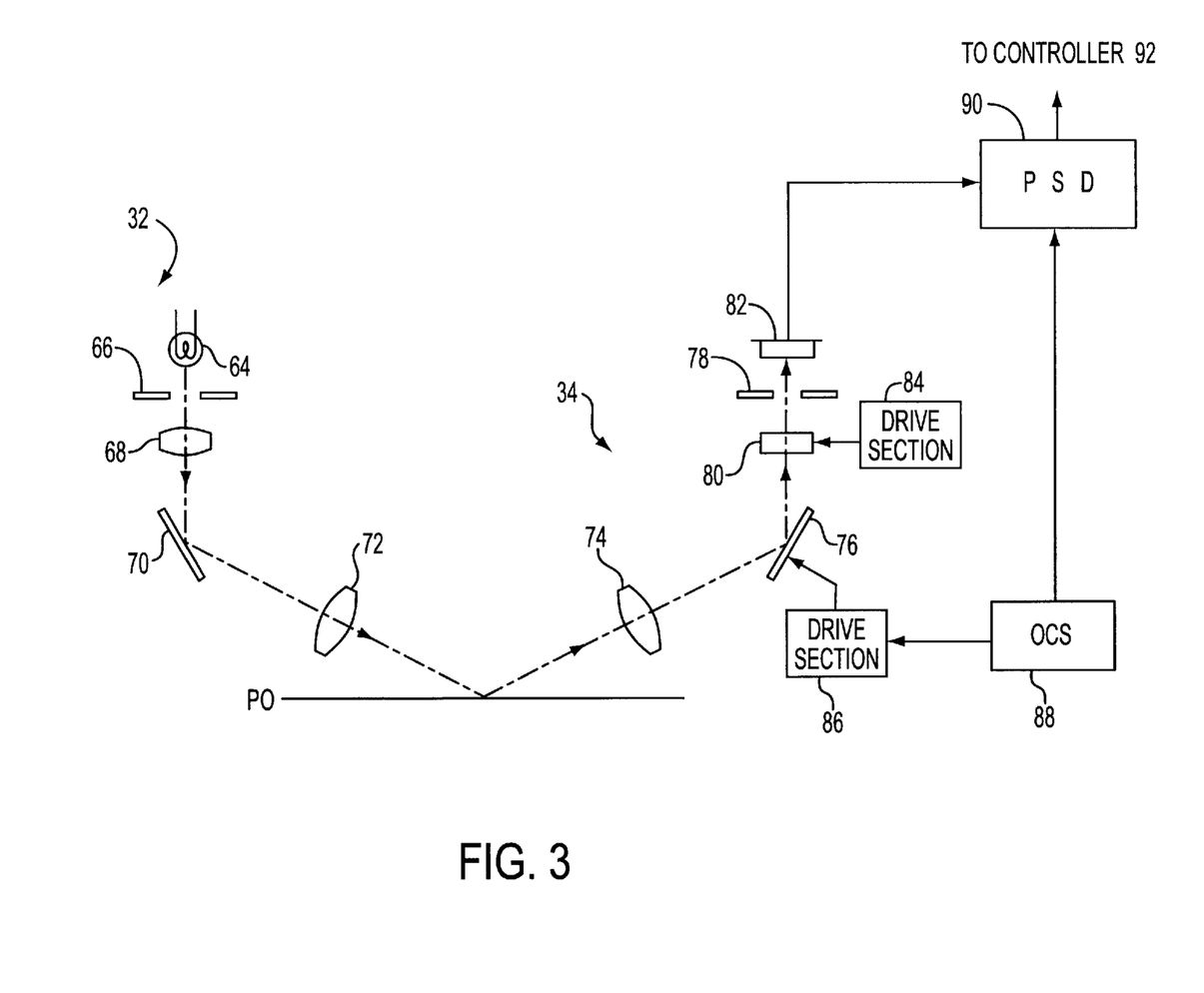
FIG. 3 is a part-schematic, part-block diagram showing the configuration of the AF (auto-focus) sensor in the projection exposure apparatus of the embodiment of FIG. 1.

Next, the auto-focus (AF) sensor (32 and 34) of the projection exposure apparatus of FIG. 1 will be described, with reference to FIG. 3. AF sensor light transmitter 32 is configured to direct an imaging beam (for forming a pinhole or slit image) diagonally toward image-formation plane P0 of projection optical system 14. The imaging beam emitted from light transmitter 32 is reflected by the surface of wafer 16. Light receiver 34 is configured to receive the light reflected by the surface of wafer 16 in order to sense the vertical position of wafer 16 (its location along the optical axis of projection optical system 14). That is, the sensors optically detect the fact that there is a difference between the location of the reflected light in the so-called "post-pin" state, in which the surface of wafer 16 is positioned below the image-formation plane P0 of projection optics 14, and the location of the reflected light in the in-focus state. Thus the vertical (Z-axis) positioning of wafer 16 is sensed by light transmitter 32 and light receiver 34 to detect any error in the positioning of the wafer 16 surface relative to image-formation plane P0 of projection optics 14.

Light transmitter 32 is made up of the following components:

light source 64, which emits light of a wavelength to which the photoresist coating on the surface wafer 16 is not photosensitive (infrared light, for example);

slit plate 66, which is illuminated by light from light source 64;

lens 68, which receives the light passed through slit plate 66;

mirror 70, which reflects the light transmitted by lens 68; and lens 72, which directs the light reflected by mirror 70 toward the surface of wafer 16. A slit running perpendicular to the page is formed in slit plate 66. That light (emitted by light source 64) that passes through the slit in slit plate 66, is formed into a beam of parallel rays by lens 68. This beam is then reflected by mirror 70 and formed by lens 72 into an image of the slit formed in slit plate 66. This image is formed in image-formation plane P0 of projection optics 14.

Light receiver 34 is made up of the following components:

lens 74, which receives the beam reflected from the surface of wafer 16;

oscillating mirror 76, which oscillates while reflecting the beam from lens 74, thereby changing the direction of the reflected beam;

slit plate 78, placed at the image-forming location of the light beam from lens 74;

parallel-plane glass 80, placed between mirror 76 and slit plate 78; and light receiver element 82, which receives the light that passes through slit plate 78.

A slit running perpendicular to the page corresponding to the slit in slit plate 66 of light transmitter 32, is formed in slit plate 78. Parallel-plane glass 80, which shifts the light beam axis, has an axis of rotation perpendicular to the page, about which it can be rotated through a given range of degrees by a drive section 84. The slit image formed by lens 74 can be positioned in the direction perpendicular to image-formation plane P0 by adjusting the angle of inclination (number of degrees of rotation) of parallel-plane glass 80. The state shown in the drawing is the state that exists when the surface of wafer 16 is coincident with image-formation plane P0.

Oscillating mirror 76 has an axis of rotation which lies perpendicular to the page. The mirror is driven about this axis in a simple harmonic motion at a given angular frequency and amplitude by a drive section 86. Drive section 86, which drives oscillating mirror 76, is operated by a drive signal from an oscillator (OSC) 88. The output of light receiver element 82 is supplied to a phase-sync detector (PSD) 90. Oscillator 88 supplies, to PSD 90, an a.c. signal, of the same phase as that of the drive signal it supplies to drive section 86. PSD 90 performs synchronous detection using the phase of this a.c. signal as its reference. The detected signal output (focus signal) from PSD 90, which is commonly referred to as an "S" curve signal, is at the zero d.c. level when the center of oscillation of the slit image being reflected from wafer 16 coincides with the center of the slit in light receiver slit plate 78. The detected signal output from PSD 90 has a positive level when the surface of wafer 16 is off-position above image-formation plane P0, and a negative level when it is below plane P0. The focus signal output from PSD 90 (its detected signal output) is supplied to controller 92, which is described below (see FIG. 4).

Once the image of the slit in slit plate 66 of light transmitter 32 has been formed on the surface of wafer 16, this image is then formed again on slit plate 78 by lens 74 of light receiver 34. This slit image on slit plate 78 is moved back and forth across slit plate 78 at a given frequency by oscillating mirror 76. FIG. 3 shows the state in which the center of oscillation of the slit image on slit plate 78 is coincident with the center of the slit in slit plate 78. If the surface of wafer 16 now moves out of position away from the image-formation plane P0 of projection optics 14, the center of oscillation of the slit image will move a corresponding amount to the left or right (as it appears in the illustration) of the center of the slit in slit plate 78.

In the present embodiment the calibration of the AF sensor (32 and 34) is performed by adjusting the inclination angle of parallel-plane glass 80 (through drive section 84). That is, with the surface of wafer 16 positioned at image-formation plane P0 of projection optics 14, and with light being reflected from the surface of wafer 16 at that time being incident upon the center of oscillation of the slit in light receiver slit plate 78, the inclination angle of parallel-plane glass 80 is adjusted (through drive section 84) for a PSD 90 focus signal output of 0.

Figure 4:
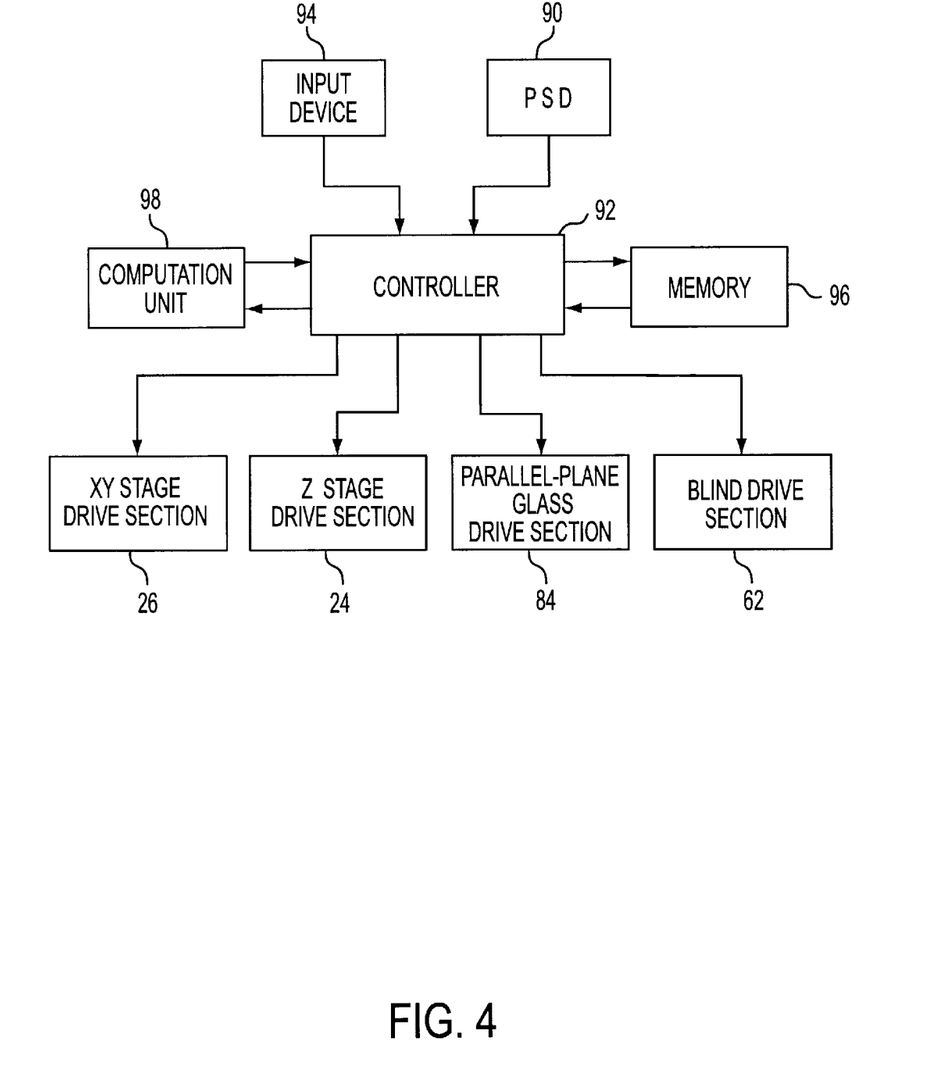
FIG. 4 is a block diagram showing the configuration of the control system in the projection exposure apparatus of the embodiment of FIG. 1.

FIG. 4 is a block diagram of the control system of the present invention. Controller 92, which performs centralized control of the entire apparatus, controls each of the following: Z-stage drive section 24, which drives Z-leveling stage 20 (see FIG. 1); XY stage drive section 26, which drives the XY stage 22; blind drive section 62, which drives reticle blind 52 in illumination system 10; and parallel-plane glass drive section 84, which drives parallel-plane glass 80 in AF sensor light receiver 34. Controller 92 receives as inputs the focus signal output from PSD 90 of the AF sensor (32 and 34) and also receives reticle blind data, etc. from an input device 94, for example, a keyboard or a main computer. Included in this reticle blind data is data on the reticle blind-regulated illumination area (selected area) on reticle 12. Generally, the reticle blind-regulated illumination area is determined in accordance with the dimensions of the pattern described on the reticle. Based on this blind data received from input device 94, controller 92 controls blind control section 62 to adjust the position of reticle blind 52. Based on the focus signal output (phase-sync detect output) from PSD 90, controller 92 also adjusts the Z-axis positioning of wafer 16 by controlling Z-stage drive section 24.

Also connected to controller 92 are a memory unit 96 and a computation unit 98, with computation unit 98 configured to compute data for the Z-axis positioning of wafer 16, based on information stored in memory unit 96. That is, information on the image plane curvature aberration and depth of focus of projection optics 14 is stored in memory unit 96, in advance, to be read out by controller 92 as required. Computation unit 98 then calculates a permissible range of Z-axis positions for wafer 16 during exposure, based on "image plane curvature aberration" and "depth of focus" data for projection optics 14 (data read from memory unit 96), and blind data (received from input device 94).

Figure 5:
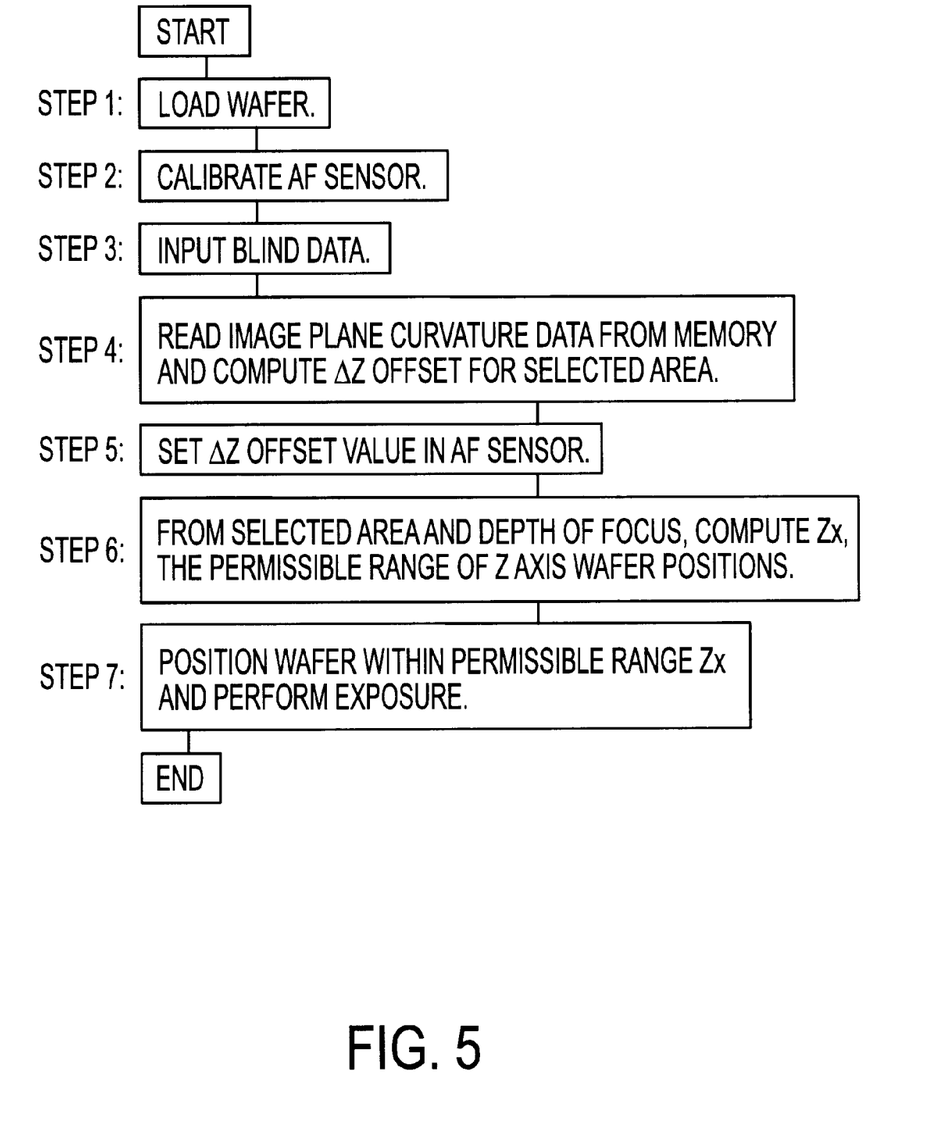
FIG. 5 is a flowchart showing the operation of the embodiment of FIG. 1.

Next, the operation of the embodiment of a projection exposure apparatus configured as described above will be described, following the flow-chart of FIG. 5. The description will be centered on operation as it relates to the positioning of wafer 16 in the optical axis (Z-axis) direction of projection optical system 14.

Step 1

The wafer 16 to be exposed is first loaded on Z-leveling stage 20.

Step 2

Next, calibration of the AF sensor (32 and 34) is performed. Specifically, Z-stage drive section 24 is first controlled by controller 92 to align a measurement point on the first shot area of wafer 16 to be exposed (shot-center, for example) with image-formation plane P0 of projection optical system 14. Then, AF sensor (32 and 34) is operated to direct the reflected beam from wafer 16 onto the center of oscillation of the slit of light receiver slit plate 78, and the inclination angle of parallel-plane glass 80 is adjusted (through drive section 84) for a PSD 90 focus signal output of 0. Once this has been done, PSD 90 will supply a zero output signal to controller 92 when wafer 16 is positioned at image-formation plane P0 on the optical axis of projection optical system 14.

Step 3

Next, blind data for reticle 12 is input from input device 94: data such as the amount of drive that must be applied to reticle blind 52 drive for the range (size of the area) of reticle 12 to be flooded with illumination light. Here, the area selected by reticle blind 52 (i.e., the area on the reticle not to be shielded from light by the reticle blind) is referred to as the "selected area."

Step 4

Next, controller 92 reads, from memory unit 96, data on the image curvature aberration of projection optical system 14. The $\Delta Z$, which is the magnitude of the focus offset in the selected area, is then calculated by computation unit 98. That is, computation unit 98 calculates the amount by which the location of the image formed at the center of the selected area is offset from image-formation plane P0 on the optical axis of projection optical system 14, due to the image curvature aberration. In general, $\Delta Z$, the focus offset magnitude, increases as the end of projection optics 14 is approached.

Step 5

Next, the focus offset magnitude $\Delta Z$ calculated in Step 4 is applied to the AF sensor (32 and 34). Specifically, under control of controller 92, the angle of inclination of parallel-plane glass 80 is adjusted, through parallel-plane glass drive section 84, by an amount corresponding to the offset magnitude $\Delta Z$. That is, it is set such that the focus signal output from PSD 90 will be zero when the surface of wafer 16 is positioned away from image-formation plane P0 on the optical axis of projection optics 14 by an amount equal to $\Delta Z$.

Step 6

In this step, computation unit 98 computes Zx, the permissible range of wafer 16 positions in the Z-axis direction, based on projection optics 14 depth of focus data, and that portion of the image curvature aberration data that applies to the selected area, which are stored in memory unit 96.

Figure 6:
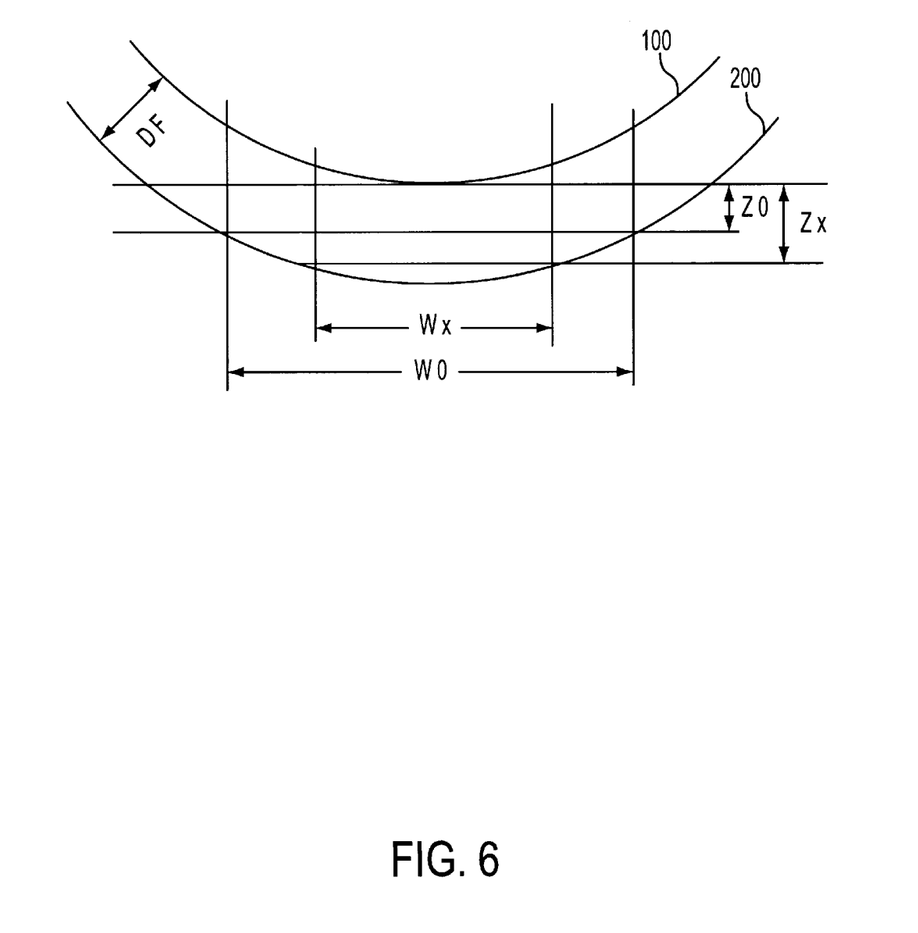
FIG. 6 is a schematic drawing illustrating the relationship between the image curvature aberration and depth of focus of the projection optical system, and the permissible range of wafer Z-axis positions.

FIG. 6 shows the depth of focus DF with the image curvature aberration of projection optics 14 taken into account: i.e., it shows the permissible range of Z-axis positions of wafer 16 during exposure. In this drawing, curves 100 and 200 show the upper and lower limits, respectively, of the permissible range of Z-axis positions. When reticle blind 52 is not used, and the entire reticle 12 pattern is projection-exposed on wafer 16, the reticle 12 pattern is projected over a range W0. Thus to keep the entire width W0 within the depth of field DF, the wafer 16 Z-axis position must be kept within the range Z0. That is, if wafer 16 rises above the upper limit of Z0, the center of the pattern will be out of focus, while if it falls below the lower limit, the outer edges of the pattern will be out of focus. If, on the other hand, the outer portion of reticle 12 is masked by reticle blind 52 so that only the central portion of the reticle 12 pattern will be exposed onto wafer 16, the reticle 12 pattern will be projected over range Wx. This will increase to the Zx, the permissible range of Z-axis positions within which wafer 16 must be maintained in order to keep the full width Wx within the depth of focus DF.

Step 7

Next, controller 92 operates XY stage drive section 26 to drive XY stage 22 to move the area of wafer 16 that is to be exposed into the imaging position of projection optical system 14. At the same time, Z-stage drive section 24 is operated to drive Z-leveling stage 20 to adjust the Z-axis positioning of wafer 16. Then, once the surface of wafer 16 has been moved inside the range within which an image projected on it can be focused, the amount of displacement from the reference focus position (to which the offset was earlier applied) is determined, based on the focus signal output from PSD 90.

Then Z-stage drive section 24 is driven so as to position Z-leveling table 20 such that this amount of positional displacement will fall within the permissible range Zx. At this time, Zx (the range of permissible Z-axis positions) is large compared to Z0 (the range of permissible Z-axis positions when the entire pattern of reticle 12 is exposed), thus the amount of time required to move Z-leveling stage 20 to perform the Z-axis positioning of wafer 16 is reduced in comparison to that required when conventional methods are used. After this, once it is has been verified by the state of the focus (phase detect) output signal from PSD 90, that wafer 16 is inside the permissible range Zx, and that requirements such as the positioning of reticle blind 52, parallel-plane glass 80, and XY stage 22 have been met, controller 92 sets a "start exposure" trigger to "on," to start the exposure.

Later, when it comes to performing the exposure of the other shot areas of wafer 16 in the prescribed sequence, Z-axis positioning alignment of wafer 16 is again performed under the same focus controls as described above.

In the foregoing, an embodiment of the present invention was described. The present invention is not, however, limited to application as described in this example, but could well be applied in a variety of variations thereof without deviating from the gist of the technical concepts of the invention as defined in the patent claims. In the above described example, for instance, the outer portion of reticle 12 was masked by reticle blind 52, and the center portion of reticle 12 used as the selected area. It goes without saying, of course, any desired area other than the center of the reticle could be set as the area of the pattern of reticle 12 to be projected (the selected area).

Various modifications will become possible for those skilled in the art after receiving the teachings of the present disclosure without departing from the scope thereof.

What is claimed is:

1. An exposure method for illuminating a mask with exposure light to expose an image of a pattern formed on a mask onto a substrate through a projection optics system having an optical axis, said method comprising the steps of:
   adjusting the size of a selected area of said mask illuminated by illumination light; and
   determining a permissible range of positions of said substrate along said optical axis of said optical system based on data related to said projection optics and said size of said selected area such that, during exposure of said substrate, the pattern in said selected area will be projected onto said substrate in a properly focused imaging state.

2. An exposure method as claimed in claim 1, further including the step of positioning said substrate within said determined permissible range of positions along said optical axis.

3. An exposure method as claimed in claim 1, further including the step of performing exposure of said selected area onto said substrate.

4. An exposure method as claimed in claim 2, further including the step of performing exposure of said selected area onto said substrate.

5. An exposure method as claimed in claim 1, further including the step of sensing the position of said substrate along said optical axis when said substrate is positioned along said optical axis.

6. An exposure method as claimed in claim 1, wherein said data related to said projection optics includes an image aberration and depth of focus of said projection optics.

7. A projection exposure apparatus for projection-exposing an image of a pattern formed on a mask onto a substrate through a projection optics system having an optical axis, said apparatus comprising:
   an illumination source to flood said mask with illumination light;
   a regulating member, which is disposed between said mask and said illumination source, to regulate the size of said illumination light which illuminates a selected area on said mask;
   a memory to store data related to said projection optical system; and
   a computation unit, coupled to said memory, to compute a permissible range of positions of said substrate along said optical axis of said optical system based on said data stored in said memory and said size of said illumination light, such that, during exposure of said substrate, the pattern in said selected area will be projected onto said substrate in a properly focused imaging state.

8. An exposure apparatus as claimed in claim 7, further comprising:
   a position measuring sensor to measure the position of said substrate along said optical axis and outputting position measurement values.

9. An exposure apparatus as claimed in claim 8, further comprising:
   a drive stage, coupled to said substrate, to change the position of said substrate along the optical axis of said projection optical system.

10. An exposure apparatus as claimed in claim 9, further comprising:
a controller, adapted to receive position measurement values obtained by said position measuring sensor, to control said drive stage to position said substrate within said determined permissible range of positions.

11. An exposure apparatus as claimed in claim 7, wherein said data stored in said memory includes the image curvature aberration and depth of focus of said projection optical system.

12. An exposure apparatus as claimed in claim 8, wherein said position measuring sensor incorporates a focus offset in said selected area based on the image curvature aberration of said optical system.

13. An exposure method for exposing an image of a pattern formed on a mask onto a substrate through a projection optics system having an optical axis and an image aberration, said method comprising:
determining a size of a selected area of said pattern which is exposed;
storing data related to said image aberration; and
computing a permissible range of the positions of said substrate along said optical axis of said optical system based on said stored data and said size of the selected area.

14. An exposure method, as claimed in claim 13, wherein said stored data includes the depth of focus of said projection optical system within a range corresponding to said selected area.

15. An exposure method, as claimed in claim 13, further comprising the step of positioning said substrate within said computed permissible range.

16. An exposure method for transferring a pattern on a mask onto a substrate via a projection system, the method comprising the steps of:
detecting a position of the substrate along the optical axis of the projection system; and
adjusting, when the substrate is exposed, the relative position of the substrate and an image plane of the projection system based on the detecting result and based on a variable predetermined permissible range for adjusting the relative position,
wherein said permissible range is determined based on exposure condition to the substrate.

17. An exposure method, for transferring a pattern on a mask onto a substrate via a projection system, the method comprising the steps of:
detecting a position of the substrate along the optical axis of the projection system; and
adjusting, when the substrate is exposed, the relative position of the substrate and an image plane of the projection system based on the detecting result and based on a variable permissible range for adjusting the relative position,
wherein said permissible range is changed according to information related to the mask.

18. The method according to claim 17, wherein said information related to the mask comprises information of the illuminated area on the mask.

19. The method according to claim 18, wherein said information of the illuminated area comprises information of the blind which sets the illuminated area on the mask.

20. The method according to claim 16, wherein said permissible range is included in the depth of focus of the projection system.

21. The method according to claim 16, wherein said adjusting step comprises moving a stage with the substrate placed thereon in a direction of the optical axis of the projection system.

22. The method according to claim 16, wherein said permissible range is determined based on exposure condition to the substrate and based on data related to the projection system.

23. The method according to claim 22, wherein said data related to the projection system comprises an image aberration and depth of focus of the projection system.

24. The method according to claim 17, wherein said permissible range is included in the depth of focus of the projection system.

25. The method according to claim 17, wherein said adjusting step comprises moving a stage with the substrate placed thereon in a direction of the optical axis of the projection system.

26. The method according to claim 17, wherein said permissible range is determined based on information related to the mask and based on data related to the projection system.

27. The method according to claim 26, wherein said data related to the projection system comprises an image aberration and depth of focus of the projection system.

* * * * *